(12) United States Patent
Wang et al.

(10) Patent No.: US 8,018,211 B2
(45) Date of Patent: Sep. 13, 2011

(54) OUTPUT VOLTAGE DETECTING CIRCUIT AND SWITCHING POWER SUPPLY HAVING SUCH OUTPUT VOLTAGE DETECTING CIRCUIT

(75) Inventors: Kuan-Sheng Wang, Taoyuan Hsien (TW); Kun-Chi Lin, Taoyuan Hsien (TW); Ying-Chieh Wang, Taoyuan Hsien (TW); Shu-Hao Chang, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 415 days.

(21) Appl. No.: 12/390,309

(22) Filed: Feb. 20, 2009

(65) Prior Publication Data

US 2010/0157627 A1     Jun. 24, 2010

(30) Foreign Application Priority Data

Dec. 18, 2008   (TW) .............................. 097149472 A

(51) Int. Cl.
  *G05F 1/10*     (2006.01)
  *G05F 5/00*     (2006.01)
  *H02M 3/00*     (2006.01)
(52) U.S. Cl. ........... 323/234; 323/282; 323/293; 363/15
(58) Field of Classification Search .................... 363/15, 363/16; 323/234, 271, 282, 293, 369
See application file for complete search history.

(56) References Cited

U.S. PATENT DOCUMENTS

| 3,517,556 | A  | * | 6/1970  | Barker ........................ 374/173 |
| 4,962,341 | A  | * | 10/1990 | Schoeff ........................ 326/43 |
| 6,493,243 | B1 | * | 12/2002 | Real ............................. 363/17 |
| 7,352,611 | B2 | * | 4/2008  | Isoda et al. ................... 365/154 |
| 7,915,899 | B2 | * | 3/2011  | Sexton et al. ................. 324/539 |
| 2008/0315682 | A1 | * | 12/2008 | Hussain ......................... 307/2 |

* cited by examiner

*Primary Examiner* — Jessica Han
(74) *Attorney, Agent, or Firm* — Kirton & McConkie; Evan R. Witt

(57) ABSTRACT

An output voltage detecting circuit includes a conducting structure, a voltage regulator, a first resistor and a second resistor. The conducting structure includes a power output return terminal, a first contact and a second contact. A compensating voltage is generated between the first and second contacts when an output current flows through the first and second contacts. The voltage regulator adjusts a first current according to a voltage across a first circuit terminal and the ground terminal of the voltage regulator, thereby generating a detecting signal according to the first current. An output voltage across the positive power output terminal and the power output return terminal is subject to voltage division by the first and second resistors to generate a divided voltage. The voltage across the first circuit terminal and the ground terminal of the voltage regulator is equal to a difference between the divided voltage and the compensating voltage.

20 Claims, 6 Drawing Sheets

OUTPUT VOLTAGE DETECTING CIRCUIT AND SWITCHING POWER SUPPLY HAVING SUCH OUTPUT VOLTAGE DETECTING CIRCUIT

FIELD OF THE INVENTION

The present invention relates to a detecting circuit, and more particularly to an output voltage detecting circuit. The present invention also relates to a switching power supply having such an output voltage detecting circuit.

BACKGROUND OF THE INVENTION

With increasing industrial development, diverse electronic devices are used to achieve various purposes. An electronic device comprises a plurality of electronic components. Generally, different kinds of electronic components are operated by using different voltages.

As known, a power supply is essential for many electronic devices such as personal computers, industrial computers, servers, communication products or network products. Usually, the user may simply plug a power supply input cable into an AC wall outlet commonly found in most homes or offices so as to receive an AC voltage. The power supply will convert the AC voltage into a regulated DC output voltage for powering the electronic device. For example, the common DC output voltage is 12 volts. The regulated DC output voltage is transmitted to the electronic device through a power cable.

Generally, the magnitude of the output voltage is dependent on the electricity consumption of the system circuit. That is, the variation of the output voltage is very large. For reducing the variation of the output voltage, the power supply usually has an output voltage detecting circuit for detecting the output voltage and generating a detecting signal according to the output voltage. According to the detecting signal, the output voltage is adjusted so as to reduce the output voltage variation.

The power supply is connected to the system circuit through a power cable. When an output current flows through the conducting cable, a conducting voltage drop is generated by the power cable. Under this circumstance, the magnitude of the voltage across both terminal of the system circuit (i.e. a system circuit terminal voltage) is not equal to the magnitude of the output voltage. Although the use of the detecting circuit can reduce the output voltage variation, the system circuit terminal voltage is also changed as the electricity consumption of the system circuit. In other words, the variation of the system circuit terminal voltage is still very large. Since the gap between the system circuit terminal voltage at the maximum electricity consumption of the system circuit and the system circuit terminal voltage at the minimum electricity consumption of the system circuit is very large, the voltage regulation needs to be improved.

For reducing the influence of the conducting voltage drop on the system circuit terminal voltage, the conventional power supply needs an additional load detecting circuit. Since the load detecting circuit needs to cooperate with the output voltage detecting circuit, the circuitry layout of the power supply becomes complicated, and the volume and the cost of the power supply are both increased.

Furthermore, the power supply is further connected to the system circuit through two additional detecting wires such that the conventional output voltage detecting circuit can generate the detecting signal according to the system circuit terminal voltage. The uses of the additional detecting wires increase the fabricating cost. In addition, the additional detecting wires occupy much working space of the power supply and thus are not feasible to be used in some small-sized or portable power supply apparatuses.

There is a need of providing an output voltage detecting circuit so as to obviate the drawbacks encountered from the prior art.

SUMMARY OF THE INVENTION

It is an object of the present invention to provide an output voltage detecting circuit for compensating the conducting voltage drop of the power cable, thereby reducing the variation of the system circuit terminal voltage and the voltage regulation.

An object of the present invention provides an output voltage detecting circuit without the use of additional load detecting circuit and detecting wires.

A further object of the present invention provides a switching power supply having an output voltage detecting circuit of the present invention.

In accordance with an aspect of the present invention, there is provided an output voltage detecting circuit. The output voltage detecting circuit includes a conducting structure, a voltage regulator, a first resistor and a second resistor. The conducting structure includes a power output return terminal, a first contact and a second contact. A compensating voltage is generated between the first contact and the second contact when an output current flows through the first contact and the second contact. The voltage regulator has a ground terminal connected to the first contact of the conducting structure for adjusting a first current according to a voltage across a first circuit terminal and the ground terminal of the voltage regulator, and generating a detecting signal according to the first current. The first resistor is connected to the second contact of the conducting structure and the first circuit terminal of the voltage regulator. The second resistor is connected to the first circuit terminal of the voltage regulator and a positive power output terminal. An output voltage across the positive power output terminal and the power output return terminal is subject to voltage division by the first resistor and the second resistor to generate a divided voltage. The voltage across the first circuit terminal and the ground terminal of the voltage regulator is equal to a difference between the divided voltage and the compensating voltage.

In accordance with another aspect of the present invention, there is provided a switching power supply. The switching power supply includes an output voltage detecting circuit of the present invention, a main power circuit and a control circuit. The main power circuit includes a switching circuit. The main power circuit is connected to the positive power output terminal and the conducting structure for receiving an input voltage and converting the input voltage into an output voltage. The control circuit is connected to a control terminal of the switching circuit of the main power circuit and the output voltage detecting circuit for controlling on/off statuses of the switching circuit according to the detecting signal, thereby controlling conversion of the input voltage into the output voltage.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
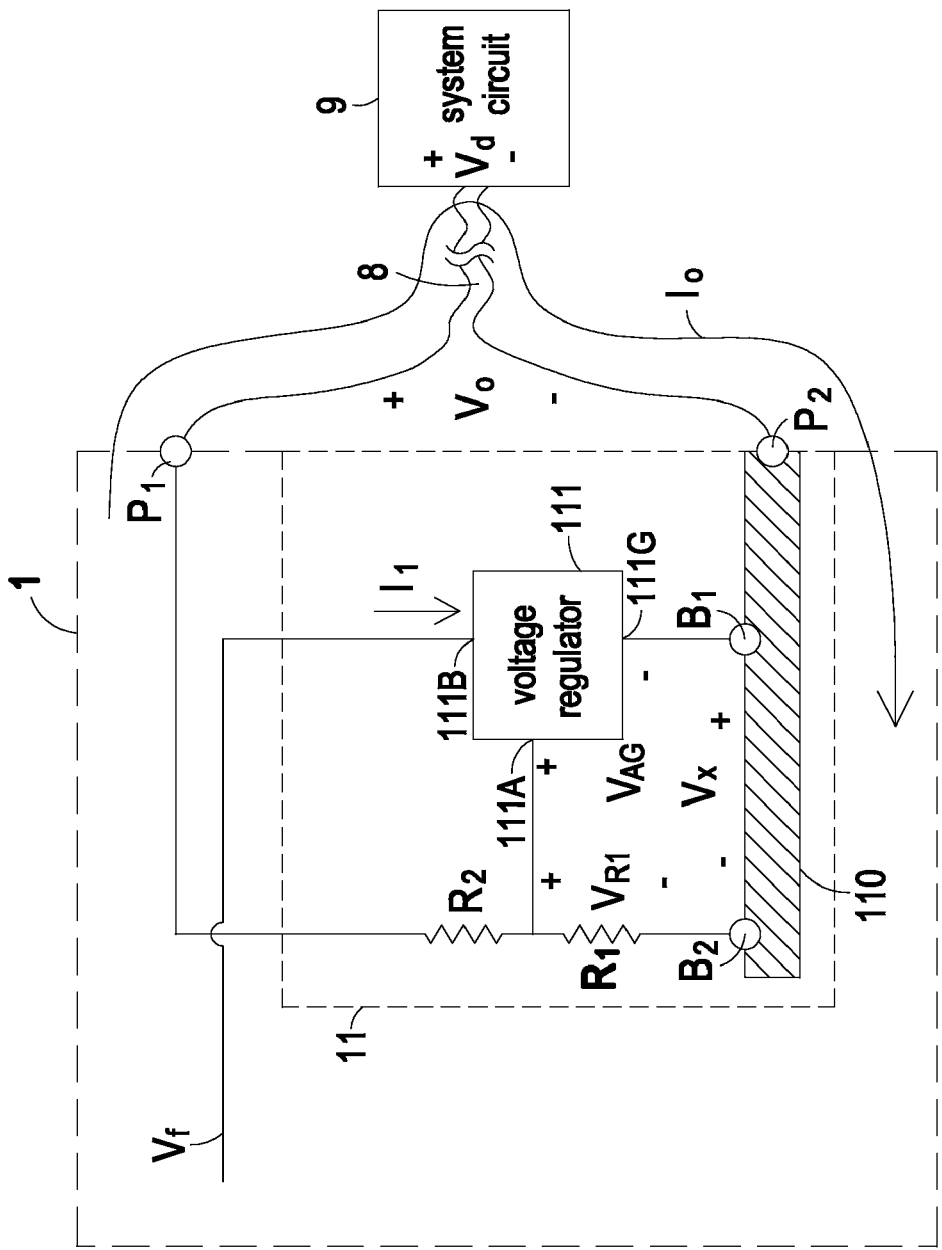
FIG. 1A is a schematic circuit diagram illustrating an output voltage detecting circuit according to a first preferred embodiment of the present invention.

FIG. 1A is a schematic circuit diagram illustrating an output voltage detecting circuit according to a first preferred embodiment of the present invention. As shown in FIG. 1A, the output voltage detecting circuit 11 is connected to the positive power output terminal $P_1$ of a switching power supply 1 and a power cable 8. The output voltage detecting circuit 11 comprises a conducting structure 110, a voltage regulator 111, a first resistor $R_1$ and a second resistor $R_2$. The conducting structure 110 comprises a power output return terminal $P_2$, a first contact $B_1$ and a second contact $B_2$. The conducting structure 110 is arranged in the loop of the output current $I_o$ coming from the power cable 8. Since the first contact $B_1$ and the second contact $B_2$ are located at different positions of the conducting structure 110, a compensating voltage $V_x$ is generated between the first contact $B_1$ and the second contact $B_2$ when the output current $I_o$ flows through the first contact $B_1$ and the second contact $B_2$. Along the path of the output current $I_o$, the first contact $B_1$ and the second contact $B_2$ are respectively located at the upstream side and the downstream side of the conducting structure 110. In other words, the output current $I_o$ coming from the power cable 8 sequentially flows through the power output return terminal $P_2$, the first contact $B_1$ and the second contact $B_2$. Since the distance between the first contact $B_1$ and the power output return terminal $P_2$ is shorter than the distance between the second contact $B_2$ and the power output return terminal $P_2$, the output current $I_o$ will flow through the first contact $B_1$ and then the second contact $B_2$.

In some embodiments, the first contact $B_1$ and the power output return terminal $P_2$ of the conducting structure 110 are located at the same position (not shown), a compensating voltage $V_x$ is also generated between the first contact $B_1$ and the second contact $B_2$ when the output current $I_o$ flows through the first contact $B_1$ and the second contact $B_2$. Along the path of the output current $I_o$ the first contact $B_1$ and the second contact $B_2$ are respectively located at the upstream side and the downstream side of the conducting structure 110. Similarly, the output current $I_o$ coming from the power cable 8 will sequentially flow through the power output return terminal $P_2$, the first contact $B_1$ and the second contact $B_2$.

An example of the voltage regulator 111 is a TI TL431 IC or other voltage-regulating component. In some embodiments, the voltage regulator 111 is composed of an operational amplifier (OP Amp) and several resistors (not shown). According to a voltage difference $V_{AG}$ between a first circuit terminal 111A and a ground terminal 111G of the voltage regulator 111 and a reference voltage (e.g. 2.495 volts), the voltage regulator 111 will automatically adjust the magnitude of a first current $I_1$ flowing into a second circuit terminal 111B of the voltage regulator 111. According to the first current $I_1$, the voltage regulator 111 generates a detecting signal $V_f$. In other words, the detecting signal $V_f$ is changed as the voltage difference $V_{AG}$ between the first circuit terminal 111A and the ground terminal 111G of the voltage regulator 111 is altered. The ground terminal 111G of the voltage regulator 111 is connected to the first contact $B_1$ of the conducting structure 110. The first circuit terminal 111A of the voltage regulator 111 is connected to an end of the first resistor $R_1$ and an end of the second resistor $R_2$. The other end of the first resistor $R_1$ is connected to the second contact $B_1$ of the conducting structure 110. The other end of the second resistor $R_2$ is connected to the positive power output terminal $P_1$ of the switching power supply 1.

In a case that the voltage regulator 111 is implemented by a TI TL431 IC, the reference terminal, the cathode and the anode of the TI TL431 IC are connected to the first circuit terminal 111A, the second circuit terminal 111B and the ground terminal 111G of the voltage regulator 111, respectively.

Figure 1B:
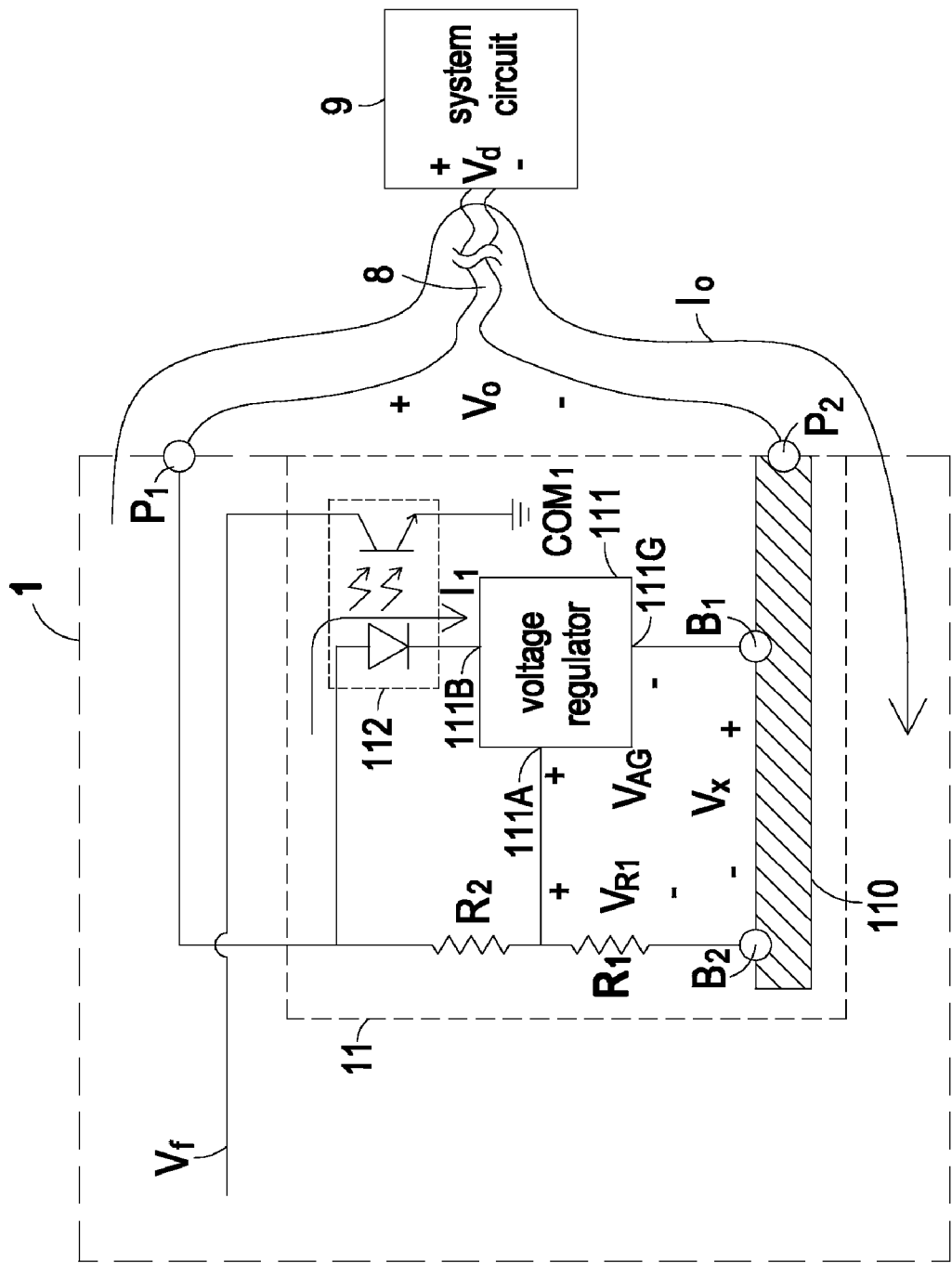
FIG. 1B is a schematic circuit diagram illustrating an output voltage detecting circuit according to a second preferred embodiment of the present invention.

FIG. 1B is a schematic circuit diagram illustrating an output voltage detecting circuit according to a second preferred embodiment of the present invention. In comparison with FIG. 1A, the output voltage detecting circuit of FIG. 1B further comprises an isolator 112. The input side of the isolator 112 is connected between the positive power output terminal $P_1$ and the second circuit terminal 111B of the voltage regulator 111. The output side of the isolator 112 is connected to a first common terminal $COM_1$. As a consequence, the first current $I_1$ flows through the input side of the isolator 112. According to the first current $I_1$, the output terminal of the isolator 112 generates a detecting signal $V_f$.

Figure 1C:
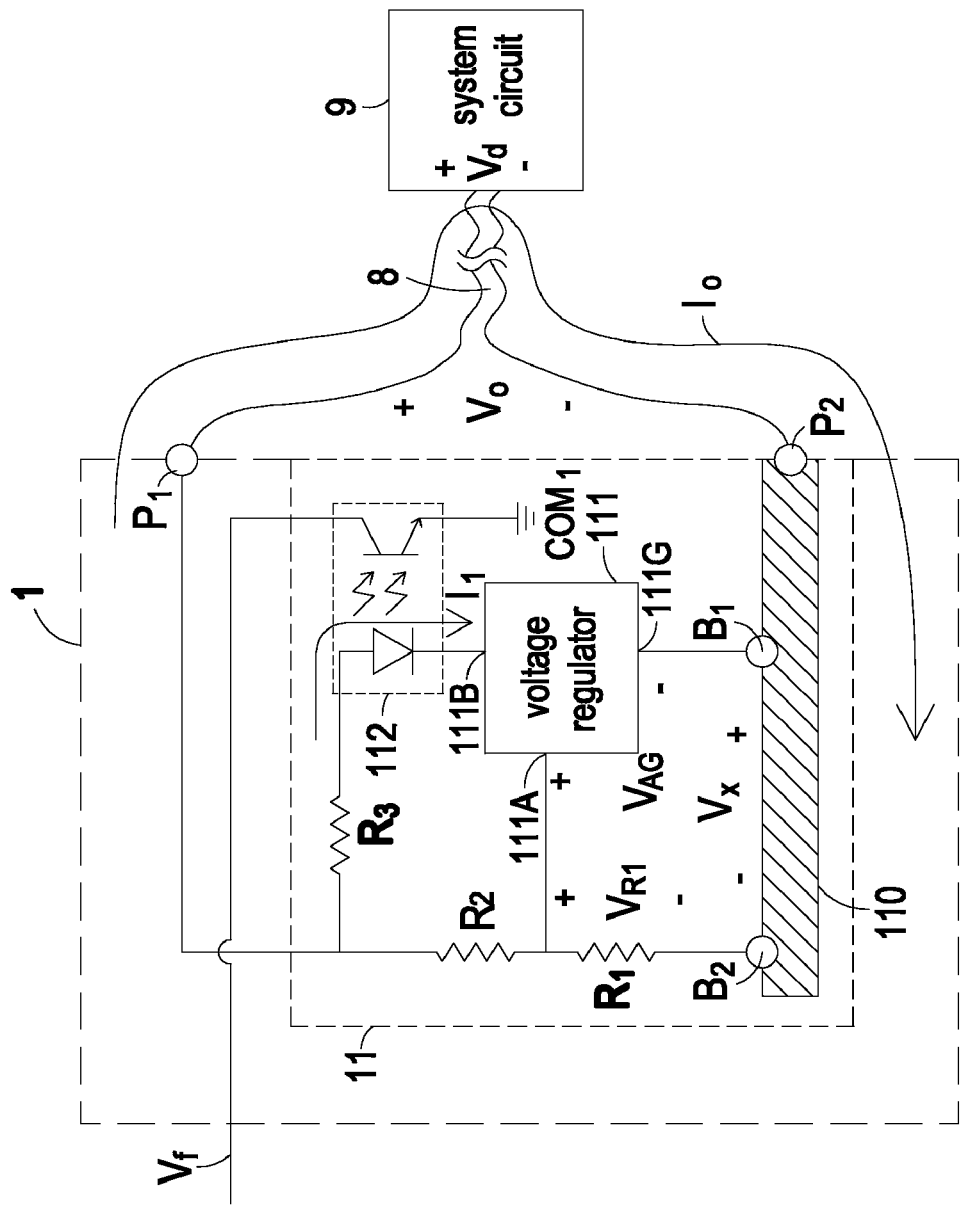
FIG. 1C is a schematic circuit diagram illustrating an output voltage detecting circuit according to a third preferred embodiment of the present invention.

FIG. 1C is a schematic circuit diagram illustrating an output voltage detecting circuit according to a third preferred embodiment of the present invention. In comparison with FIG. 1B, the output voltage detecting circuit of FIG. 1C further comprises a third resistor $R_3$. The third resistor R3 and the input side of the isolator 112 are serially connected between the positive power output terminal $P_1$ and the second circuit terminal 111B of the voltage regulator 111. In this embodiment, an end of the third resistor $R_3$ is connected to the positive power output terminal $P_1$. The other end of the third resistor $R_3$ is connected to a first end of the input side of the isolator 112. A second end of the input side of the isolator 112 is connected to the second circuit terminal 111B of the voltage regulator 111. As a consequence, the first current $I_1$ flows through the third resistor $R_3$ and the input side of the isolator 112.

The output voltage $V_o$ between the positive power output terminal $P_1$ and the power output return terminal $P_2$ is subject to voltage division by the serially-connected components $R_1$ and $R_2$, thereby generating a divided voltage $V_{R1}$ across both ends of the first resistor $R_1$. The relation between the divided voltage $V_{R1}$ and the output voltage $V_o$ is deduced as follows:

$$V_{R1} = \frac{R_1}{R_1 + R_2} \cdot V_o.$$

The voltage difference $V_{AG}$ between the first circuit terminal 111A and the ground terminal 111G of the voltage regulator 111 is equal to the difference between the divided voltage $V_{R1}$ and the compensating voltage $V_x$. The relation between the divided voltage $V_{R1}$, the voltage difference $V_{AG}$ and the compensating voltage $V_x$ is deduced as follows:

$$V_{AG} = V_{R1} - V_X = \frac{R_1}{R_1 + R_2} \cdot V_o - V_X,$$

that is, $$V_{R1} = V_{AG} + V_x.$$

In other words, the first current $I_1$ that is adjustable by the voltage regulator 111 is changed as the divided voltage $V_{R1}$ and the compensating voltage $V_x$ are altered. Correspondingly, the detecting signal $V_f$ is changed as the divided voltage $V_{R1}$ and the compensating voltage $V_x$ are altered. Since the divided voltage $V_{R1}$ is changed as the output voltage $V_o$ is altered and the compensating voltage $V_x$ is changed as the output current $I_o$ is altered, the detecting signal $V_f$ is changed as the output voltage $V_o$ and the output current $I_o$ are altered.

Since there is a conducting voltage drop $V_L$ when the output current $I_o$ flows through the conducting cable 8, the system circuit terminal voltage $V_d$ is equal to the conducting voltage drop $V_L$ subtracted from the output voltage $V_o$, i.e. $V_d = V_o - V_L$. As such, the magnitude of the system circuit terminal voltage $V_d$ is smaller than the magnitude of the output voltage $V_o$. In other words, the magnitude of the detecting signal $V_f$ generated by the output voltage detecting circuit 11 according to the output voltage $V_o$ is greater than the magnitude of the detecting signal $V_f$ generated according to the system circuit terminal voltage $V_d$. Since the compensating voltage $V_x$ is changed as the output current $I_o$ is altered, the conducting voltage drop $V_L$ is changed as the output current $I_o$. In accordance with a key feature of the present invention, the output voltage detecting circuit 11 uses the compensating voltage $V_x$ to compensate the conducting voltage drop $V_L$, so that the detecting signal $V_f$ is more highly related to the conducting voltage drop $V_L$ of the power cable 8.

Figure 2:
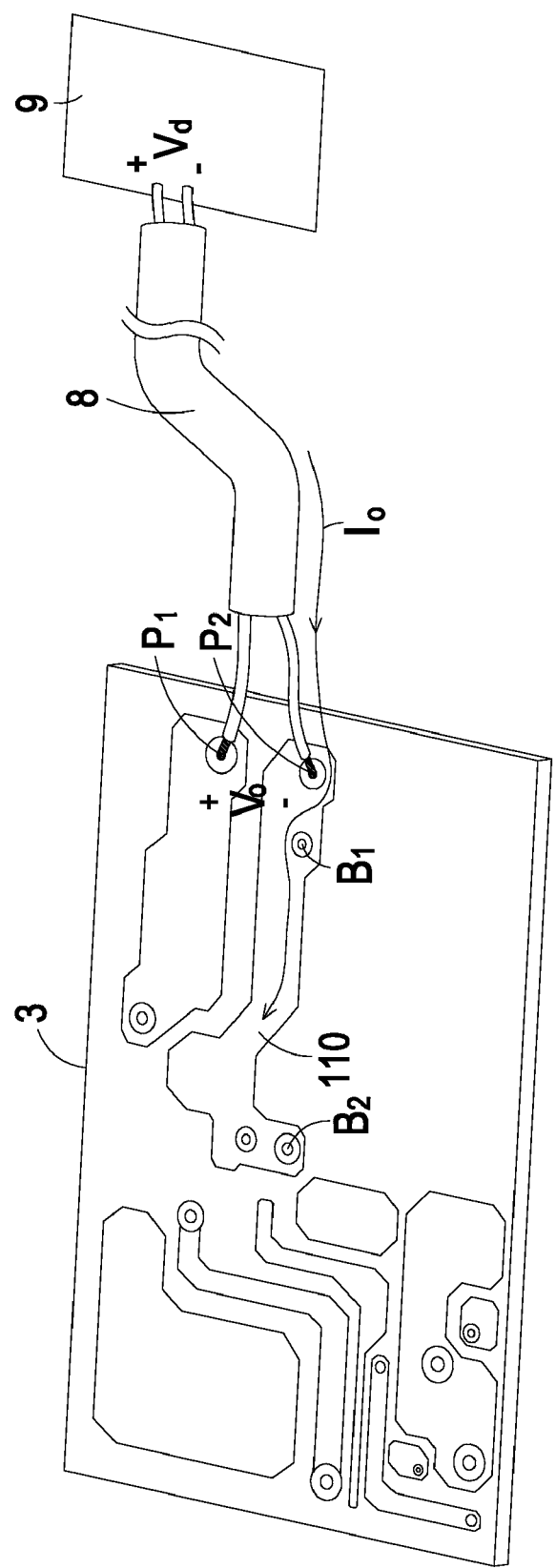
FIG. 2 is a schematic view illustrating the layout configuration of the conducting structure of the output voltage detecting circuit of the present invention.

FIG. 2 is a schematic view illustrating the layout configuration of the conducting structure of the output voltage detecting circuit of the present invention. As shown in FIG. 2, the conducting structure 110 is formed on the printed circuit board (PCB) 3. The conducting structure 110 is formed of for example copper coil or other metallic material. The conducting structure 110 comprises a power output return terminal $P_2$, a first contact $B_1$ and a second contact $B_2$. The power cable 8 is connected to the positive power output terminal $P_1$, the power output return terminal $P_2$ and the system circuit 9. The conducting structure 110 is arranged in the loop of the output current $I_o$ coming from the power cable 8. The output current $I_o$ flows through the positive power output terminal $P_1$, the power cable 8 and the system circuit 9, and then flows into the conducting structure 110 through the power output return terminal $P_2$. Likewise, there is a conducting voltage drop $V_L$ when the output current $I_o$ flows through the conducting cable 8, and thus the magnitude of the system circuit terminal voltage $V_d$ is smaller than the magnitude of the output voltage $V_o$ across the positive power output terminal $P_1$ and the power output return terminal $P_2$.

Since the first contact $B_1$ and the second contact $B_2$ are respectively located at the upstream side and the downstream side of the conducting structure 110 along the path of the output current $I_o$, the output current $I_o$ coming from the power cable 8 sequentially flows through the power output return terminal $P_2$, the first contact $B_1$ and the second contact $B_2$. When the output current $I_o$ flows through the first contact $B_1$ and the second contact $B_2$, a compensating voltage $V_x$ is also generated between the first contact $B_1$ and the second contact $B_2$.

The conducting structure 110 may have an arbitrary shape. Due to the resistance property of the conducting structure 110, the conducting structure 110 is preferably designed to have a rectangular shape (not shown).

Figure 3:
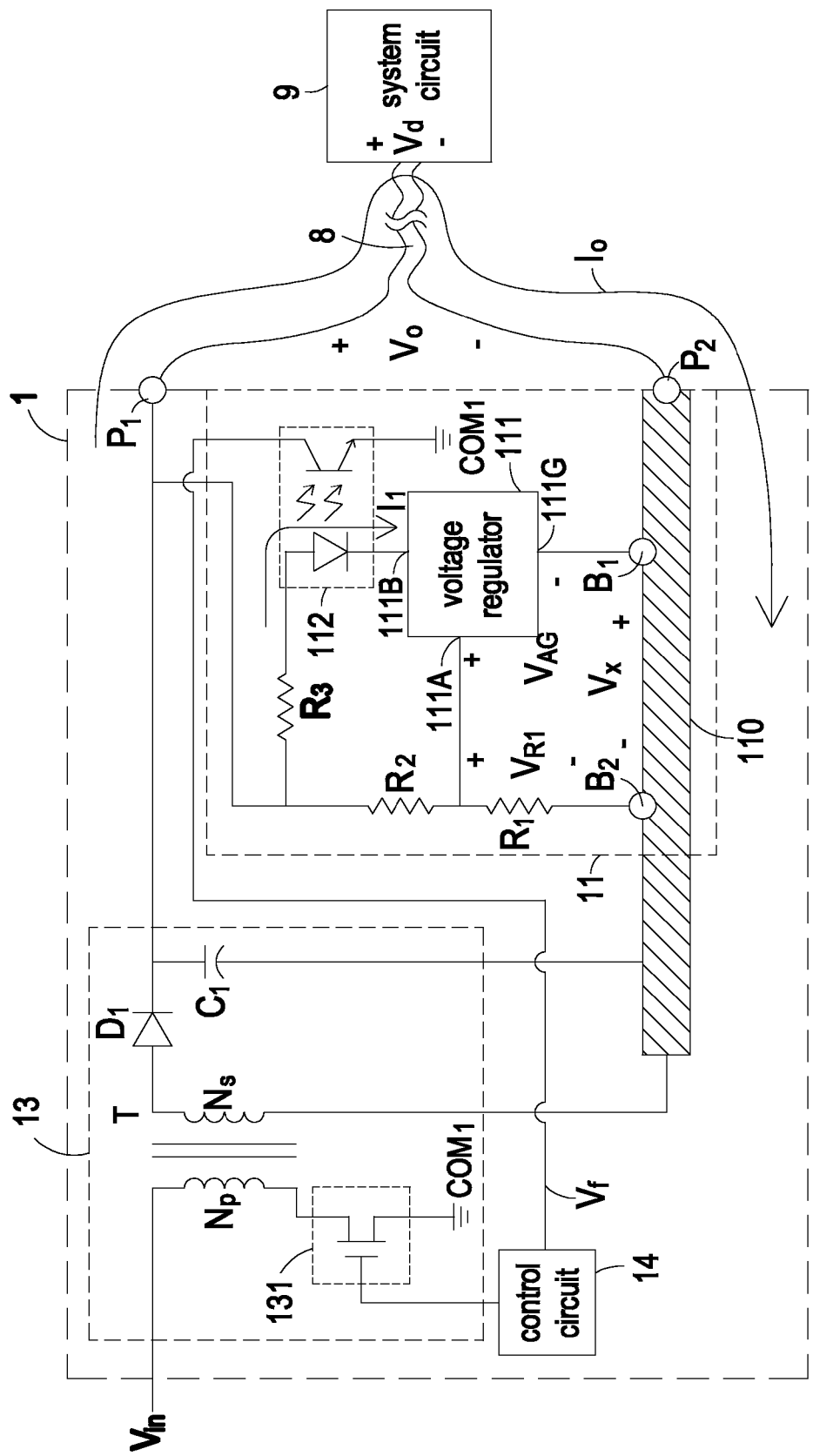
FIG. 3 is a schematic circuit diagram illustrating an exemplary switching power supply having the output voltage detecting circuit of the present invention.

FIG. 3 is a schematic circuit diagram illustrating an exemplary switching power supply having the output voltage detecting circuit of the present invention. In this embodiment, the switching power supply 1 comprises the output voltage detecting circuit 11 of FIG. 1C, a main power circuit 13 and a control circuit 14. The main power circuit 13 is connected to the control circuit 14, the positive power output terminal $P_1$ and the conducting structure 110. The electric energy of the input voltage $V_{in}$ is received by the main power circuit 13 and the input voltage $V_{in}$ is converted into the output voltage $V_o$ by the main power circuit 13. In this embodiment, the main power circuit 13 comprises a transformer T, a switching circuit 131, a first diode $D_1$ and a first capacitor $C_1$. The transformer T comprises a primary winding assembly $N_p$, and a secondary winding assembly $N_s$. The primary winding assembly $N_p$ of the transformer T is connected to the switching circuit 131. An end of the secondary winding assembly $N_s$ is connected to the anode of the first diode $D_1$. The other end of the secondary winding assembly $N_s$ is connected to the conducting structure 110. The switching circuit 131 is connected to the primary winding assembly $N_p$, the first common terminal $COM_1$ and the control circuit 14. The switching circuit 131 is controlled by the control circuit 14 such that the electric energy of the input voltage $V_{in}$ is transmitted from the primary winding assembly $N_p$ to the secondary winding assembly $N_s$ of the transformer T. The anode of the first diode $D_1$ is connected to an end of the secondary winding assembly $N_s$ of the transformer T. The cathode of the first diode $D_1$ is connected to an end of the first capacitor $C_1$ and the positive power output terminal $P_1$. The other end of the first capacitor $C_1$ is connected to the conducting structure 110.

The control circuit 14 is connected to the control terminal of the switching circuit 131 of the main power circuit 13 and the output side of the isolator 112 of the output voltage detecting circuit 11. According to the detecting signal $V_f$, the on/off statuses of the switching circuit 131 are controlled by the control circuit 14. For example, the duty cycle or the operating frequency of the switching circuit 131 is adjusted under control of the control circuit 14. As such, the electric energy of the input voltage $V_{in}$ is transmitted from the primary winding assembly $N_p$ to the secondary winding assembly $N_s$ of the transformer T. By the main power circuit 13, the input voltage $V_{in}$ is converted into the output voltage $V_o$. An example of the control circuit 14 includes but is not limited to a pulse width modulation (PWM) controller, a digital signal processor (DSP) or a pulse frequency modulation (PFM) controller.

The output voltage $V_o$ between the positive power output terminal $P_1$ and the power output return terminal $P_2$ is subject to voltage division by the serially-connected components $R_1$ and $R_2$ of the output voltage detecting circuit 11, thereby generating a divided voltage $V_{R1}$ across both ends of the first resistor $R_1$. The relation between the divided voltage $V_{R1}$ and the output voltage $V_o$ is deduced as follows:

$$V_{R1} = \frac{R_1}{R_1 + R_2} \cdot V_o.$$

The voltage difference $V_{AG}$ between the first circuit terminal 111A and the ground terminal 111G of the voltage regulator 111 is equal to the difference between the divided voltage $V_{R1}$ and the compensating voltage $V_x$. The relation between the divided voltage $V_{R1}$, the voltage difference $V_{AG}$ and the compensating voltage $V_x$ is deduced as follows:

$$V_{AG} = V_{R1} - V_X = \frac{R_1}{R_1 + R_2} \cdot V_o - V_X,$$

that is, $$V_{R1} = V_{AG} + V_x.$$

In other words, the first current $I_1$ that is adjustable by the voltage regulator 111 is changed as the divided voltage $V_{R1}$ and the compensating voltage $V_x$ are altered. Correspondingly, the detecting signal $V_f$ is changed as the divided voltage $V_{R1}$ and the compensating voltage $V_x$ are altered. Since the divided voltage $V_{R1}$ is changed as the output voltage $V_o$ is altered and the compensating voltage $V_x$ is changed as the output current $I_o$ is altered, the detecting signal $V_f$ is changed as the output voltage $V_o$ and the output current $I_o$ are altered.

Since the compensating voltage $V_x$ is changed as the output current $I_o$ is altered, the conducting voltage drop $V_L$ is changed as the output current $I_o$. In accordance with a key feature of the present invention, the output voltage detecting circuit 11 uses the compensating voltage $V_x$ to compensate the conducting voltage drop $V_L$, so that the detecting signal $V_f$ is more highly related to the conducting voltage drop $V_L$ of the power cable 8. After the output voltage $V_o$ is compensated, the system circuit terminal voltage $V_d$ is also compensated and thus the voltage change of the system circuit terminal voltage $V_d$ is reduced.

For example, if the rated voltage of the output voltage $V_o$ is 12 volts but the system circuit terminal voltage $V_d$ is not 12 volts, the compensated system circuit terminal voltage $V_d$ can be maintained at 12 volts (i.e. the rated voltage) after the conducting voltage drop $V_L$ of the power cable 8 is compensated with the compensating voltage $V_x$.

Figure 4:
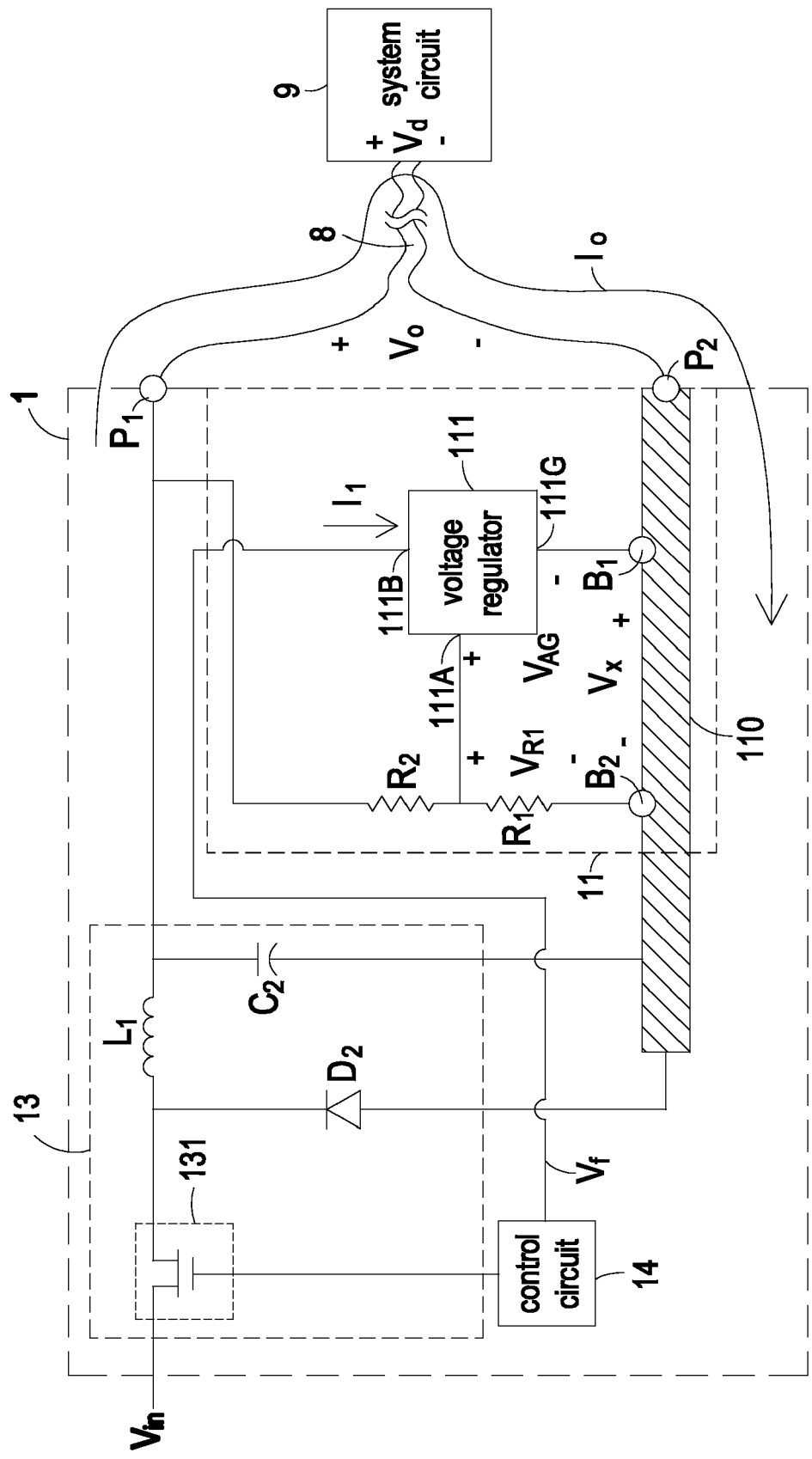
FIG. 4 is a schematic circuit diagram illustrating another exemplary switching power supply having the output voltage detecting circuit of the present invention.

FIG. 4 is a schematic circuit diagram illustrating another exemplary switching power supply having the output voltage detecting circuit of the present invention. In this embodiment, the switching power supply 1 comprises the output voltage detecting circuit 11 of FIG. 1A, a main power circuit 13 and a control circuit 14. The main power circuit 13 and the control circuit 14 of the switching power supply of FIG. 4 are different from those of FIG. 3.

As shown in FIG. 4, the main power circuit 13 comprises a switching circuit 131, a first inductor $L_1$, a second diode $D_2$ and a second capacitor $C_2$. The switching circuit 131 is connected to the control circuit 14, the first inductor $L_1$ and the cathode of the second diode $D_2$. An end of the first inductor $L_1$ is connected to the switching circuit 131 and the cathode of the second diode $D_2$. The other end of the first inductor $L_1$ is connected to an end of the second capacitor $C_2$. The anode of the second diode $D_2$ is connected to the conducting structure 110. The cathode of the second diode $D_2$ is connected to the switching circuit 131 and the first inductor $L_1$. An end of the second capacitor $C_2$ is connected to the other end of the first inductor $L_1$. The other end of the second capacitor $C_2$ is connected to the conducting structure 110.

The control circuit 14 is connected to the control terminal of the switching circuit 131 of the main power circuit 13 and the second circuit terminal 111B of the voltage regulator 111. According to the detecting signal $V_f$, the on/off statuses of the switching circuit 131 are controlled by the control circuit 14. As such, the electric energy of the input voltage $V_{in}$ is filtered by the first inductor $L_1$ and the second capacitor $C_2$, and thus the main power circuit 13 generates the output voltage $V_o$.

Similarly, the output voltage $V_o$ between the positive power output terminal $P_1$ and the power output return terminal $P_2$ is subject to voltage division by the serially-connected components $R_1$ and $R_2$ of the output voltage detecting circuit 11, thereby generating a divided voltage $V_{R1}$ across both ends of the first resistor $R_1$. The relation between the divided voltage $V_{R1}$ and the output voltage $V_o$ is deduced as follows:

$$V_{R1} = \frac{R_1}{R_1 + R_2} \cdot V_o.$$

The voltage difference $V_{AG}$ between the first circuit terminal 111A and the ground terminal 111G of the voltage regulator 111 is equal to the difference between the divided voltage $V_{R1}$ and the compensating voltage $V_x$. The relation between the divided voltage $V_{R1}$, the voltage difference $V_{AG}$ and the compensating voltage $V_x$ is deduced as follows:

$$V_{AG} = V_{R1} - V_X = \frac{R_1}{R_1 + R_2} \cdot V_o - V_X,$$

that is, $$V_{R1} = V_{AG} + V_x.$$

In other words, the first current $I_1$ that is adjustable by the voltage regulator 111 is changed as the divided voltage $V_{R1}$ and the compensating voltage $V_x$ are altered. Correspondingly, the detecting signal $V_f$ is changed as the divided voltage $V_{R1}$ and the compensating voltage $V_x$ are altered. Since the divided voltage $V_{R1}$ is changed as the output voltage $V_o$ is altered and the compensating voltage $V_x$ is changed as the output current $I_o$ is altered, the detecting signal $V_f$ is changed as the output voltage $V_o$ and the output current $I_o$ are altered.

In some embodiments, when the switching circuit 131 is controlled by the control circuit 14 according to the detecting signal $V_f$, the voltage difference $V_{AG}$ between the first circuit terminal 111A and the ground terminal 111G of the voltage regulator 111 is adjusted to be equal to the reference voltage (e.g. 2.495 volts).

Since the compensating voltage $V_x$ is changed as the output current $I_o$ is altered, the conducting voltage drop $V_L$ is changed as the output current $I_o$. Since the output voltage detecting circuit 11 uses the compensating voltage $V_x$ to compensate the conducting voltage drop $V_L$, the detecting signal $V_f$ is more highly related to the conducting voltage drop $V_L$ of the power cable 8. After the output voltage $V_o$ is compensated, the system circuit terminal voltage $V_d$ is also compensated and thus the voltage change of the system circuit terminal voltage $V_d$ is reduced.

From the above description, the output voltage detecting circuit of the present invention generates the detecting signal according to the compensating voltage and the output voltage. Since the output voltage detecting circuit uses the compensating voltage $V_x$ to compensate the conducting voltage drop $V_L$, the detecting signal $V_f$ is more highly related to the conducting voltage drop $V_L$ of the power cable. Under this circumstance, the variation of the system circuit terminal voltage is reduced and the voltage regulation is also decreased. Moreover, since no additional load detecting circuit is required, the output voltage detecting circuit has simplified circuitry and the volume and cost thereof are reduced. In addition, since no additional detecting wire is required, the space utilization of the switching power supply is enhanced. Therefore, the output voltage detecting circuit of the present invention is also feasible to be used in some small-sized or portable power supply apparatuses.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An output voltage detecting circuit comprising:
   a conducting structure comprising a power output return terminal, a first contact and a second contact, wherein a compensating voltage is generated between said first contact and said second contact when an output current flows through said first contact and said second contact;
   a voltage regulator having a ground terminal connected to said first contact of said conducting structure for adjusting a first current according to a voltage across a first circuit terminal and said ground terminal of said voltage regulator, and generating a detecting signal according to said first current;
   a first resistor connected to said second contact of said conducting structure and said first circuit terminal of said voltage regulator; and
   a second resistor connected to said first circuit terminal of said voltage regulator and a positive power output terminal,
   wherein an output voltage across said positive power output terminal and said power output return terminal is subject to voltage division by said first resistor and said second resistor to generate a divided voltage, and said voltage across said first circuit terminal and said ground terminal of said voltage regulator is equal to a difference between said divided voltage and said compensating voltage.

2. The output voltage detecting circuit according to claim 1 wherein said first resistor has an end connected to said second contact of said conducting structure and the other end connected to said first circuit terminal of said voltage regulator, and said second resistor has and end connected to said first circuit terminal of said voltage regulator and the other end connected to said positive power output terminal.

3. The output voltage detecting circuit according to claim 1 further comprising an isolator, wherein an input side of said isolator is connected between said positive power output terminal and a second circuit terminal of said voltage regulator, and said detecting signal is outputted from an output side of said isolator according to said first current.

4. The output voltage detecting circuit according to claim 3 further comprising a third resistor, wherein said third resistor and said input side of said isolator are serially connected between said positive power output terminal and said second circuit terminal of said voltage regulator.

5. The output voltage detecting circuit according to claim 1 wherein said first contact and said power output return terminal of said conducting structure are located at the same position.

6. The output voltage detecting circuit according to claim 1 wherein said divided voltage is equal to a voltage across both ends of said first resistor.

7. The output voltage detecting circuit according to claim 1 wherein said positive power output terminal and said power output return terminal are connected to a system circuit through a power cable, so that a system circuit terminal voltage is transmitted to said system circuit through said power cable.

8. The output voltage detecting circuit according to claim 7 wherein said first contact and said second contact are respectively located at an upstream side and a downstream side of said conducting structure along a path of said output current such that said output current coming from said power cable sequentially flows through said power output return terminal, said first contact and said second contact of said conducting structure.

9. The output voltage detecting circuit according to claim 1 wherein the distance between said first contact and said power output return terminal is shorter than the distance between said second contact and said power output return terminal.

10. A switching power supply comprising:
    an output voltage detecting circuit comprising:
        a conducting structure comprising a power output return terminal, a first contact and a second contact, wherein a compensating voltage is generated between said first contact and said second contact when an output current flows through said first contact and said second contact;
        a voltage regulator having a ground terminal connected to said first contact of said conducting structure for adjusting a first current according to a voltage across a first circuit terminal and said ground terminal of said voltage regulator, and generating a detecting signal according to said first current;
        a first resistor connected to said second contact of said conducting structure and said first circuit terminal of said voltage regulator; and
        a second resistor connected to said first circuit terminal of said voltage regulator and a positive power output terminal,
    a main power circuit connected to said positive power output terminal and said conducting structure for receiving an input voltage and converting said input voltage into an output voltage, wherein said main power circuit includes a switching circuit; and
    a control circuit connected to a control terminal of said switching circuit of said main power circuit and said output voltage detecting circuit for controlling on/off statuses of said switching circuit according to said detecting signal, thereby controlling conversion of said input voltage into said output voltage,
    wherein said output voltage across said positive power output terminal and said power output return terminal is subject to voltage division by said first resistor and said second resistor to generate a divided voltage, and said voltage across said first circuit terminal and said ground terminal of said voltage regulator is equal to a difference between said divided voltage and said compensating voltage.

11. The switching power supply according to claim 10 wherein said output voltage detecting circuit further includes an isolator, wherein an input side of said isolator is connected between said positive power output terminal and a second circuit terminal of said voltage regulator, and said detecting signal is outputted from an output side of said isolator according to said first current.

12. The switching power supply according to claim 10 wherein said main power circuit further comprises:
   a transformer comprising a primary winding assembly and a secondary winding assembly, wherein said primary winding assembly is connected to said switching circuit, and said secondary winding assembly is connected to said conducting structure;
   a first diode having an anode connected to said secondary winding assembly and a cathode connected to said positive power output terminal; and
   a first capacitor having an end connected to said cathode of said first diode and the other end connected to said conducting structure.

13. The switching power supply according to claim 10 wherein said main power circuit further comprises:
   a first inductor having a first end connected to said switching circuit;
   a second diode having an anode connected to said conducting structure and a cathode connected to said switching circuit and said first end of said first inductor; and
   a second capacitor having an end connected to a second end of said first inductor and the other end connected to said conducting structure.

14. The switching power supply according to claim 10 wherein said control circuit is a pulse width modulation controller or a digital signal processor.

15. The switching power supply according to claim 10 wherein said first resistor has an end connected to said second contact of said conducting structure and the other end connected to said first circuit terminal of said voltage regulator, and said second resistor has an end connected to said first circuit terminal of said voltage regulator and the other end connected to said positive power output terminal.

16. The switching power supply according to claim 10 wherein said divided voltage is equal to a voltage across both ends of said first resistor.

17. The switching power supply according to claim 10 wherein said positive power output terminal and said power output return terminal are connected to a system circuit through a power cable, so that a system circuit terminal voltage is transmitted to said system circuit through said power cable.

18. The switching power supply according to claim 17 wherein said first contact and said second contact are respectively located at an upstream side and a downstream side of said conducting structure along a path of said output current such that said output current coming from said power cable sequentially flows through said power output return terminal, said first contact and said second contact of said conducting structure.

19. The switching power supply according to claim 10 wherein said the distance between said first contact and said power output return terminal is shorter than the distance between said second contact and said power output return terminal.

20. The switching power supply according to claim 10 wherein said first contact and said power output return terminal of said conducting structure are located at the same position.

* * * * *